United States Patent [19]

Suppelsa et al.

[11] Patent Number: 5,455,446
[45] Date of Patent: Oct. 3, 1995

[54] LEADED SEMICONDUCTOR PACKAGE HAVING TEMPERATURE CONTROLLED LEAD LENGTH

[75] Inventors: Anthony B. Suppelsa; Robert F. Darveaux; Michael L. Weiss, all of Coral Springs, Fla.

[73] Assignee: Motorola, Inc., Schaumburg, Ill.

[21] Appl. No.: 268,368

[22] Filed: Jun. 30, 1994

[51] Int. Cl.[6] .............................. H01L 29/41; H01L 29/43
[52] U.S. Cl. .................. 257/467; 257/666; 257/696; 257/747; 257/750; 257/762; 257/766
[58] Field of Search ...................... 257/692, 696, 257/735, 736, 747, 750, 666, 669, 674, 677, 762, 766, 467

[56] References Cited

U.S. PATENT DOCUMENTS

| | | | |
|---|---|---|---|
| 4,673,967 | 6/1987 | Hingorany | 257/696 |
| 5,041,901 | 8/1991 | Kitano et al. | 257/696 |
| 5,329,158 | 7/1994 | Lin | 257/736 |
| 5,360,991 | 11/1994 | Abys et al. | 257/736 |

FOREIGN PATENT DOCUMENTS

| | | | |
|---|---|---|---|
| 0241956 | 10/1986 | Japan | 257/677 |
| 0289151 | 11/1989 | Japan | 257/696 |
| 0073562 | 3/1991 | Japan | 257/677 |

OTHER PUBLICATIONS

*Semiconductor International,* May 1994, "Ultrathin Packages: Are They Ahead of Their Time?", pp. 48–52.

*Primary Examiner*—William Mintel
*Assistant Examiner*—Peter Toby Brown
*Attorney, Agent, or Firm*—Dale W. Dorinski

[57] ABSTRACT

A plastic leaded semiconductor package (20) has a semiconductor device (614) encapsulated in the package and mounted to a lead frame (612). The lead frame has a plurality of leads (622) that extend beyond the body (610) of the encapsulated package. Each of the plurality of leads is made from a metal having a predetermined coefficient of thermal expansion. A second metal (627) with a different coefficient of thermal expansion is disposed on at least one portion of each of the leads.

14 Claims, 5 Drawing Sheets

5,455,446

LEADED SEMICONDUCTOR PACKAGE HAVING TEMPERATURE CONTROLLED LEAD LENGTH

TECHNICAL FIELD

This invention relates in general to semiconductor packages, and more specifically to leaded, small outline packages.

BACKGROUND

Large integrated circuit (IC) packages, specifically Thin Small Outline Packages (TSOPs) and Quad Flat Packages (QFPs) have lead material made from one homogeneous metal, usually ALLOY 42, KOVAR or copper. The leads extend radially from the edges of the IC packages, and are formed into a "gull wing" or "S" shape to facilitate interconnection of the leads to a substrate or printed circuit board. The choice of the lead frame material is usually dictated by the die size, or the substrate material that the package is to be assembled to. In the case of TSOPs, the IC is very large, so the lead material and die paddle to which the IC is attached is usually made of a metal that closely approximates the thermal expansion characteristics of the IC, typically ALLOY 42 or KOVAR. These materials have a thermal expansion coefficient of 4.3 to 5.9 parts per million per degree Centigrade (ppm/° C.), which approximates that of the silicon IC device at 3 ppm/° C. These packages are usually solder interconnected to copper pads on printed wiring boards (PWBs) that have thermal expansion characteristics of 17 to 20 ppm/° C. This mismatch between the IC package and the PWB causes shortened life of the solder interconnection, leading to premature failure of the electronic product employing the IC package. Clearly, as the die sizes become larger, this problem will become more aggravated, and a solution to the solder joint failure is needed.

SUMMARY OF THE INVENTION

Briefly, according to the invention, there is provided a leaded semiconductor package, comprising a semiconductor device encapsulated in the package and mounted to a lead frame. The lead frame has a plurality of leads that extend beyond the body of the encapsulated package. Each of the plurality of leads is made from a metal having a predetermined coefficient of thermal expansion. A second metal with a different coefficient of thermal expansion is disposed on at least one portion of each of the leads.

DETAILED DESCRIPTION OF THE PREFERRED EMBODIMENT

The lead portions of the package are formed to expand or contract with changes in the temperature of the package, in order that the linear thermal expansion of the combination of the molded package body plus the package leads precisely matches the linear expansion characteristics of the printed circuit board to which it is soldered. In one embodiment, the metal leads are formed as a "gull wing", or "s" shape. A second metal section is attached to the upper and lower surfaces of the leads so that it becomes an integral part of the lead. The second metal has a coefficient of thermal expansion (TCE) that is larger than the TCE of the first lead material, and is located on the upper surface and the lower surface of the lead in the precise location of the inner radius surface of the "S" shaped lead or the "gull wing" shaped lead, such that it will straighten and lengthen the lead during increased thermal excursions, and better match the thermal expansion of the PWB (or other substrate) to which it is interconnected. Alternatively, the second metal may have a TCE that is smaller than the TCE of the lead material, and is located on the upper surface and the lower surface of the lead in the precise location of the inner radius surface of the "S" or "gull wing" shaped lead, such that it will bend and shorten the lead during increased thermal excursions, and better match the thermal expansion of the substrate to which it is connected.

In still other embodiments, the second metal may have a TCE that is smaller than the TCE of the lead material, and is located on the upper surface and the lower surface of the lead in the precise location of the outer radius surface of the "S" or "gull wing" shaped lead, such that it will straighten and lengthen the lead during increased thermal excursions. Alternatively, the second metal may have a TCE that is smaller than the TCE of the lead material, and is located on the upper surface and the lower surface of the lead in the precise location of the inner radius surface of the "S" shaped lead or the "gull wing" shaped lead, such that it will bend and shorten the lead during increased thermal excursions.

In still another embodiment, the second metal has a TCE that is different than the thermal coefficient of the first lead material, and is located on the lower surface of the lead in the precise location of the solder interconnection to the PWB metallization, such that it will precisely match the thermal expansion of the PWB metallization to which it is solder interconnected.

Figure 1:
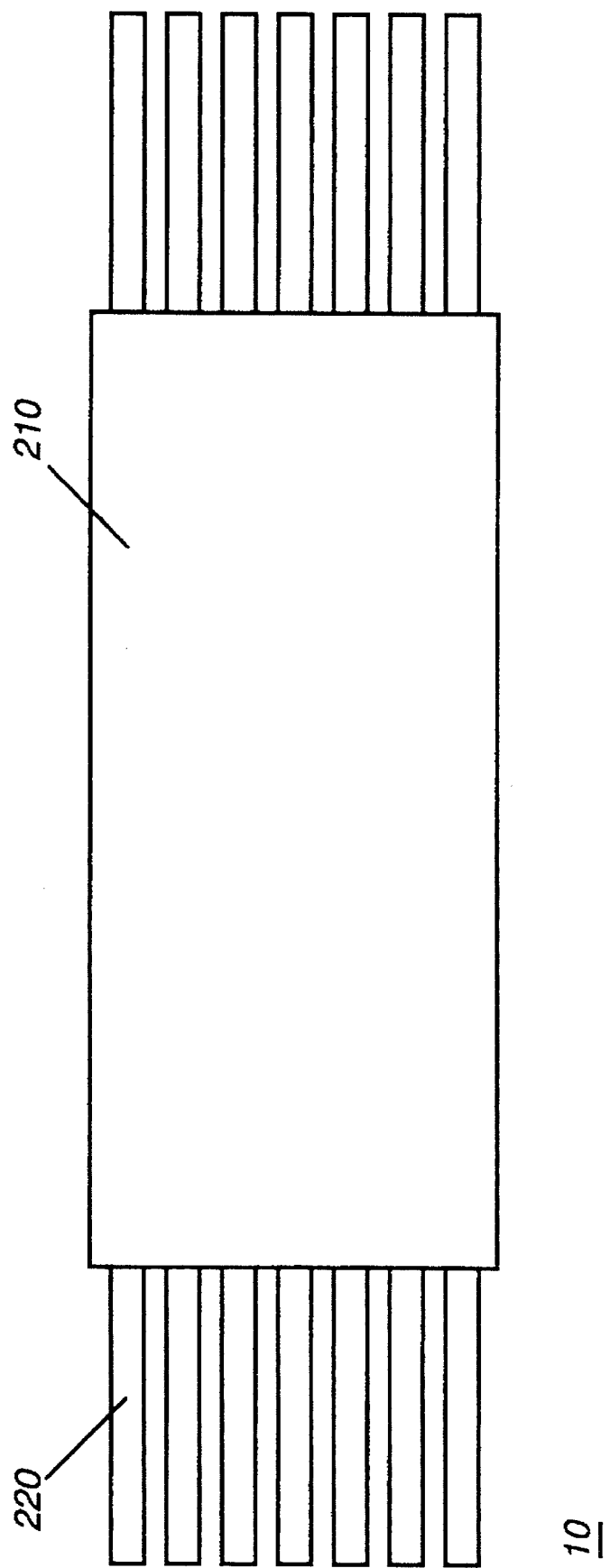
FIG. 1 is a plan view of a prior art TSOP.
Figure 2:
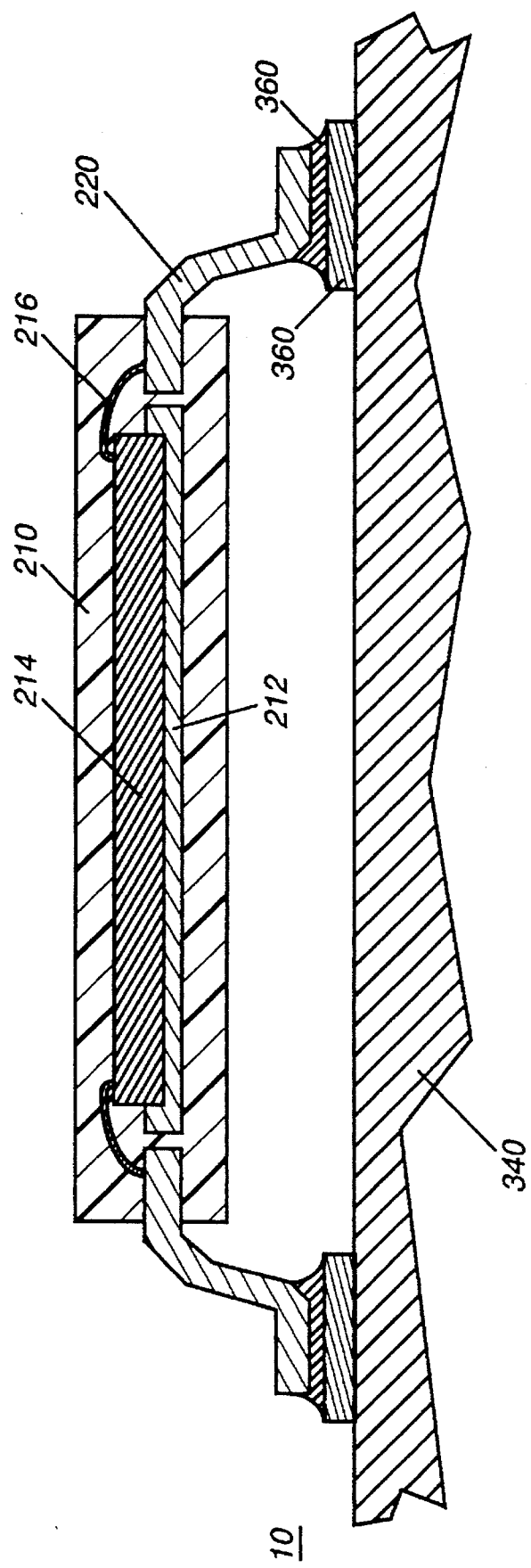
FIG. 2 is a cross-sectional view of a prior art TSOP, that is solder interconnected to a PWB.

While the specification concludes with claims defining the features of the invention that are regarded as novel, it is believed that the invention will be better understood from a consideration of the following description in conjunction with the drawing figures, in which like reference numerals are carried forward. First, a constructional example of the prior art will be described with reference to FIGS. 1–3. As depicted in FIG. 1, a TSOP package 10, has a molded body portion 210, and the leads portion 220 extending beyond the body portion of the package. FIG. 2 illustrates a cross-sectional view of the TSOP 10, where a TSOP lead 220 is interconnected with solder 360 to a copper pad 346 of a substrate such as a printed wiring board 340. The molded body portion 210 of the TSOP 10 covers the metallic die paddle 212, to which an integrated circuit 214 is bonded, and also covers the wire bonds 216 that electrically interconnect the IC 214 to the leads 220. In the case of TSOP which have very large integrated circuit chips 214, the die pad material 212 is typically a material such as ALLOY 42, which has a coefficient of thermal expansion of 4.3 ppm/° C., and closely matches the TCE of the IC 214, of 3 ppm/° C. An alternate die pad material can be KOVAR which has a thermal coefficient of expansion of 5.9 ppm/° C. The overall TSOP 10 therefore will have a temperature coefficient of expansion that approximates that of the materials from which it is made, falling between about 4 and 8 ppm/° C. The thermal coefficient of expansion of the PWB 340 is between 12 and 40 ppm/° C., and thus concentrates excessive stress on the solder interconnect 360 during thermal cycling of the electronic assembly during normal operating use of the assembly.

Figure 3:
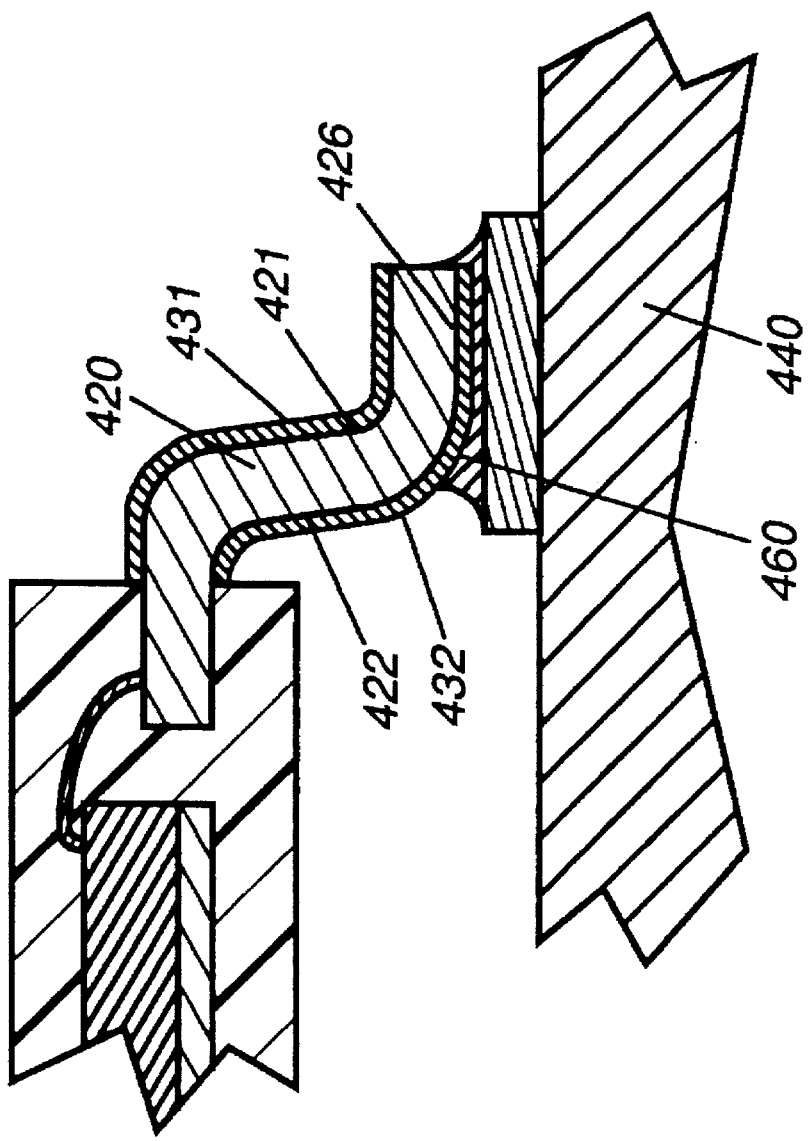
FIG. 3 is a cross-sectional schematic view of a portion of FIG. 2, depicting the deflection that a TSOP lead, solder attached to a PWB, experiences during thermal cycling.

Referring now to FIG. 3, the TSOP lead 420 has an upper surface 421 and a lower surface 422. As the temperature of the TSOP-PWB assembly increases, the PWB 440 (having a TCE of between 12 and 40 ppm/° C.) expands farther than the TSOP package (having a TCE of between 4.3 and 8 ppm/° C.), and deforms the TSOP lead 420 to place the lower deflected surface at new position 432. Conversely, as the temperature of the TSOP-PWB assembly decreases, the PWB 440 contracts farther than the TSOP package and deforms the TSOP lead 420 to position the upper deflected surface at position 431. This lead deflection will concentrate the bending stress of the system into the solder joint 460, which will ultimately fail from fatigue. There is a TCE mismatch between the lead, the solder and the substrate, because the solder TCE is about 24 ppm/° C. and the ALLOY 42 lead has a TCE of 4.3 ppm/° C., and the substrate copper pad 446 has a TCE of about 16.8 ppm/° C., all of which exacerbates the stress produced locally at the solder interconnect 460, thereby accelerating the time to solder joint failure.

Figure 5:
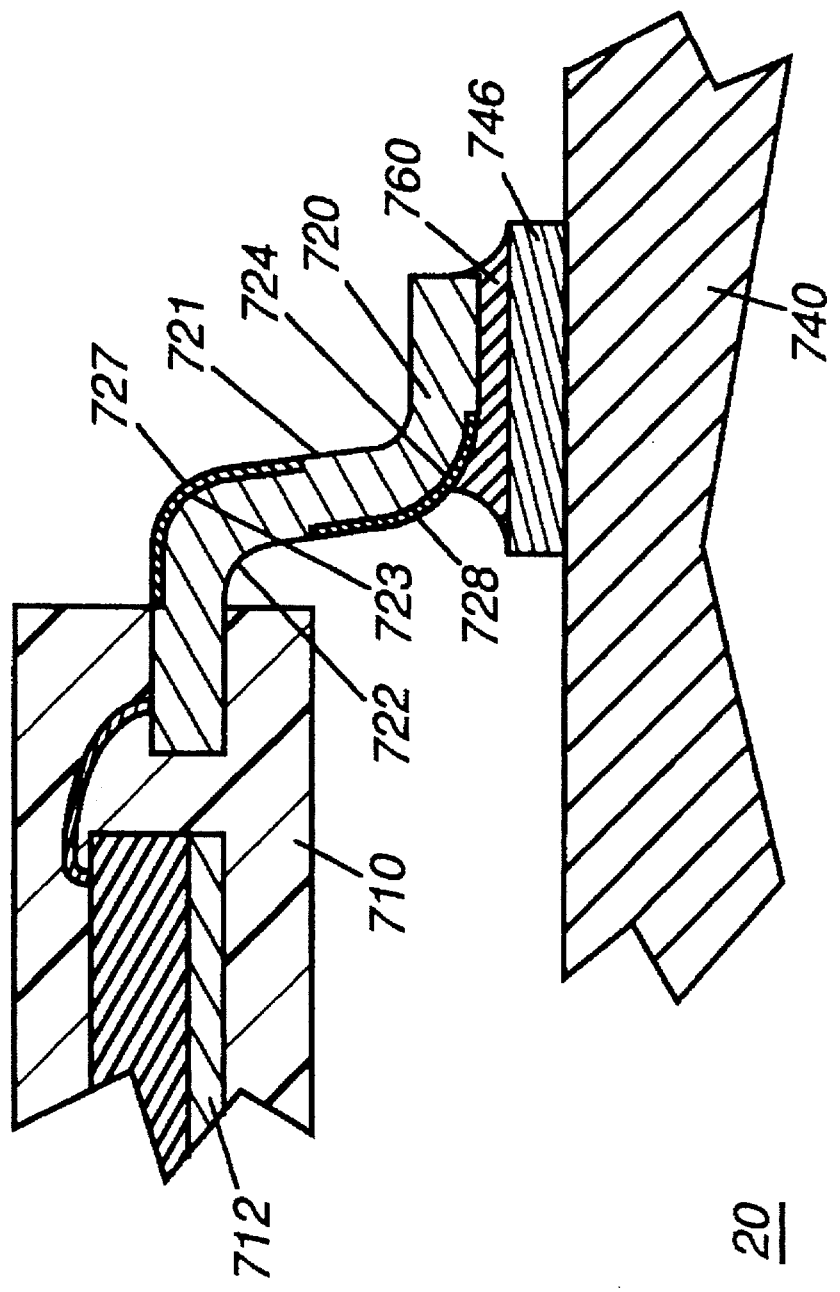
FIG. 5 is a cross-sectional view of a preferred embodiment of the invention.

This invention embodies an IC package having a "gull wing" or s-shaped lead which is a combination of two or more electrically conductive metals or alloys, each metal having different TCE values. The preferred embodiment is illustrated in FIG. 5. The molded body portion 710 of the TSOP package 20, has a "gull wing" or "s" shaped lead 720, that can be ultimately soldered 760 to a PWB 740. The package lead 720 is copper, which matches the copper pad 746 of the PWB 740. With this configuration, there is no local TCE mismatch between lead and pad at the solder interconnect interfaces. The ALLOY 42 die pad material 712 is not the same as that of package lead material 720. Specifically, the multiple coplanar "gull wing" or "s" shaped leads 720 of the integrated circuit package 20 are described as follows: an electrically conducting first metal 720, for example copper, has an upper surface 721 and a lower surface 722. The upper surface 721, contains a recessed area 723, into which a second metal 727 is deposited. Those skilled in the art will appreciate that there are several ways to selectively deposit this metal, for example, by cladding, extrusion, plating, etc. The second metal 727 is a metal or alloy with a TCE less than that of the first metal 720. The lower surface 722 also contains a recessed feature 724, into which a second metal 728 is attached. The second metal 728 is a metal or alloy with TCE less than that of the first metal 720. The second conductive metal insert portions 727 and 728 can be any of the materials listed in TABLE I that have a TCE less than the 16.8 ppm/° C. of copper, and preferably ALLOY 42, Alloy 52, KOVAR, iron, nickel or gold. KOVAR® is a registered trademark of the Westinghouse Electric Corporation, and has a composition of approximately 29% nickel, 17% cobalt and the balance iron; ALLOY 42 has a composition of approximately 42% nickel and approximately 57% iron; ALLOY 52 has a composition of approximately 52% nickel and the balance iron. The location of the second metal 727 on the upper surface is on the convex surface, or exterior of one knee, or outer largest radius of curvature, of the formed gull wing. The location of the second metal 728 on the second opposing surface is on the exterior of the other knee, or outer largest radius of curvature of the formed gull wing. Since the TCE of the second metal is smaller than the TCE of the first metal 720, it will partially straighten the lead, thus lengthening the lead, as the temperature increases. Likewise, this metallic insert and difference of expansion characteristics will increase the lead bending, and thus shorten the lead length, as the temperature decreases, in order to match the expansion and contraction of the PWB 740.

One alternate method of minimizing this thermally imposed stress is to make the portion of the lead frame that the die is mounted to (the die pad) out of a material that matches the TCE of the IC, and then make the leads out of a material that more closely approximates the TCE of the substrate. In this instance, the die pad portion would be ALLOY 42, and the leads would be copper.

Figure 4:
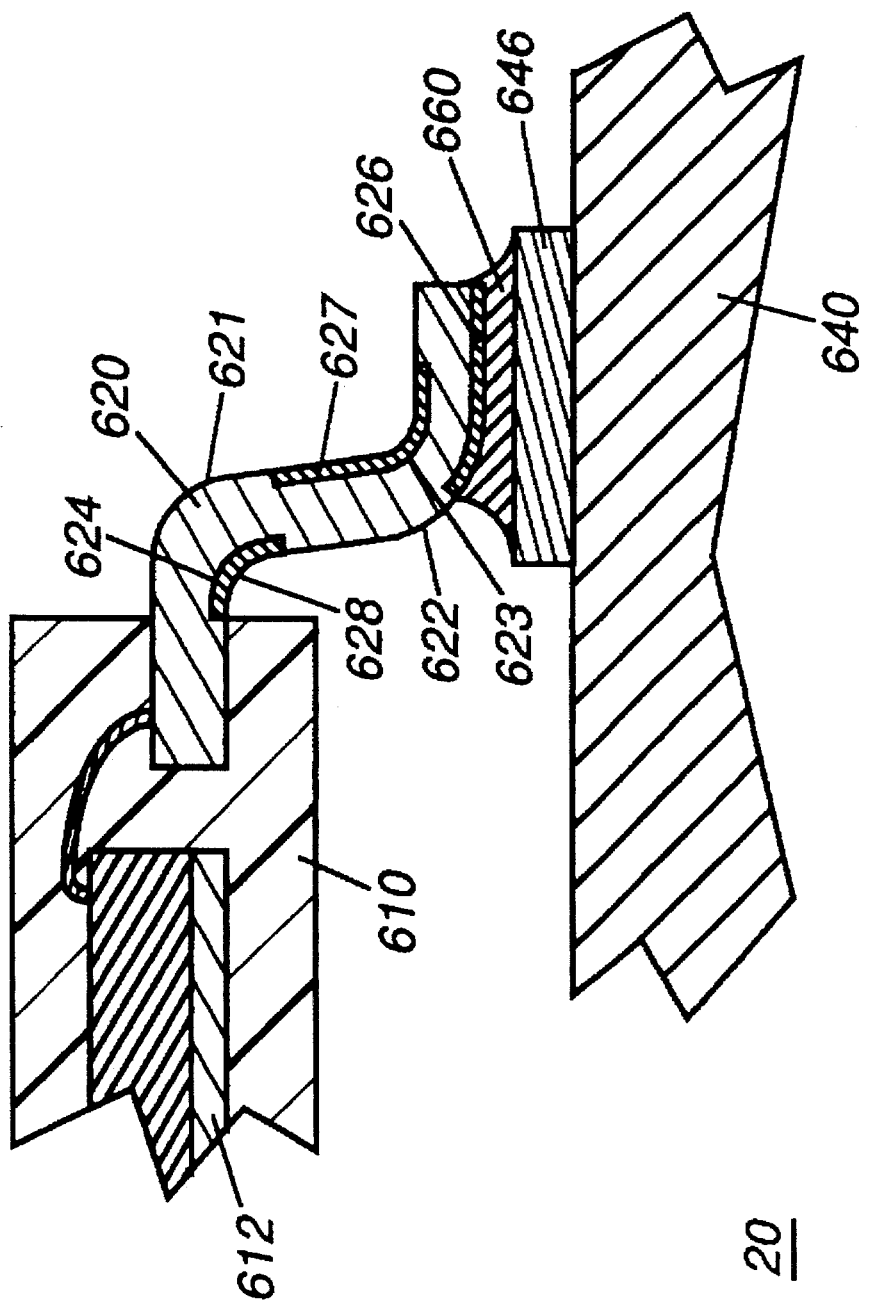
FIG. 4 is a cross-sectional view of a portion of one embodiment of the TSOP package interconnected to a PWB, in accordance with the invention.

FIG. 4 is an alternate embodiment of the invention, illustrating a portion of the molded body portion 610 of a TSOP package 20, and a "gull wing" or "s" shaped TSOP lead 620, that is soldered 660 to a PWB 640. The ALLOY 42 die pad material 612 is the same as that of package lead material 620. Specifically, the multiple coplanar "gull wing" or "s" shaped leads 620 of this integrated circuit package, comprise: an electrically conducting shaped member or lead 620 made of, for example ALLOY 42, having upper surface 621, and lower surface 622. One portion 623 of the upper surface 621 contains a metal or metal alloy 627 that is attached to the lead, and which has a TCE greater than that of the lead. Another portion 624 of the lead 620, contains a metal or metal alloy 628 that is attached to the lead and has a TCE greater than that of the lead. A third metal 626 is attached to another portion of lead 620, at the lead end so that it will become the surface that solder interconnects to the copper land 646. Metal 626 is copper, and matches the TCE of PWB land 646, in order to remove local stress in the solder interconnect due to dissimilar metals.

*The Handbook of Chemistry and Physics,* CRC Press, Boca Raton, Fla., Page F-123, March 1982, lists the physical properties of various metals and alloys, including their TCE.

TABLE 1

| Metal/Alloy | TCE |
| --- | --- |
| Copper | 16.8 ppm/°C. |
| Silver | 19.6 ppm/°C. |
| ALLOY 42 | 4.3 ppm/°C. |
| Nickel ALLOY 52 | 9.95 ppm/°C. |
| Aluminum | 23.9 ppm/°C. |
| Gold | 14.2 ppm/°C. |
| Iron | 12.2 ppm/°C. |
| KOVAR | 5.9 ppm/°C. |
| Nickel | 13.3 ppm/°C. |

The metal insert portions 627 and 628 can be any of the materials listed above that are greater than 4.2 ppm/° C., preferably copper, nickel, aluminum, or Alloy 52

The location of the both the metals 627 and 628 is at the concave or inner or smallest radius of curvature of the formed gull wing. The thermal expansion characteristics of the metals are greater than the thermal expansion characteristics of the lead 620, and will partially straighten the lead, and thus lengthen the lead, as the temperature increases. Conversely, this metallic insert location and difference in expansion characteristics will increase the lead bending, and thus shorten the lead length, as the temperature decreases, in order to match the expansion and contraction of the PWB 640.

It can now be appreciated that the instant invention solves the problems of TCE mismatch between the TSOP and the PWB encountered in the prior art. By modifying the structure of the lead frame to produce leads that will more closely approximate the TCE of the mounting substrate, the stress on the accompanying solder joint is reduced, thereby increasing the life and reliability of the assembled component, and thus, improving the electronic product.

While the preferred embodiments of the invention have been illustrated and described, it will be clear that the invention is not so limited. For example, the exterior surfaces of all package leads may be provided to be solderable surfaces. This is consistent with the present state of the art in electronic packaging, and can be achieved by electroplating a coating of tin, silver, gold, or tin/lead alloy, or tinning in molten solder. Numerous modifications, changes, variations, substitutions and equivalents will occur to those skilled in the art without departing from the spirit and scope of the present invention as defined by the appended claims. Although only one lead shape has been shown in the drawings, other configurations may be substituted, and still fall within the scope of the invention.

What is claimed is:

1. A semiconductor device encapsulated in a package and mounted to a lead frame having a plurality of leads extending outside the package, each of the plurality of leads comprising:

an "s" shaped member having an upward facing surface with concave and convex portions and having a downward facing surface with concave and convex portions, and having a first coefficient of thermal expansion;

a first metal bonded to only the concave portion of said upward facing surface, the first metal having a coefficient of thermal expansion substantially different from the first coefficient of thermal expansion;

a second metal bonded to only the concave portion of said downward facing surface, the second metal having a coefficient of thermal expansion substantially different from the first coefficient of thermal expansion.

2. The semiconductor package as described in claim 1, wherein the "s" shaped member is copper.

3. The semiconductor device as described in claim 1, wherein the first metal and second metal are the same material.

4. The semiconductor package as described in claim 3, wherein the first metal and the second metal are an alloy comprising 42% nickel and 57% iron.

5. The semiconductor package as described in claim 1, wherein the coefficient of thermal expansion of both the first metal and the second metal is less than the first coefficient of thermal expansion.

6. The semiconductor package as described in claim 1, wherein the coefficient of thermal expansion of the both the first metal and the second metal is greater than the first coefficient of thermal expansion.

7. A semiconductor device encapsulated in a package and mounted to a lead frame having a plurality of leads extending outside the package, each of the plurality of leads comprising:

an "s" shaped member having an upward facing surface with concave and convex portions and having a downward facing surface with concave and convex portions, and having a first coefficient of thermal expansion;

a first metal bonded to only the convex portion of said upward facing surface, the first metal having a coefficient of thermal expansion substantially different from the first coefficient of thermal expansion;

a second metal bonded to only the convex portion of said downward facing surface, the second metal having a coefficient of thermal expansion substantially different from the first coefficient of thermal expansion.

8. The semiconductor package as described in claim 7, wherein the "s" shaped member is copper.

9. The semiconductor device as described in claim 7, wherein the first metal and second metal are the same material.

10. The semiconductor package as described in claim 9, wherein the first metal and the second metal are an alloy comprising 42% nickel and 57% iron.

11. The semiconductor package as described in claim 7, wherein the coefficient of thermal expansion of both the first metal and the second metal is less than the first coefficient of thermal expansion.

12. The semiconductor package as described in claim 7, wherein the coefficient of thermal expansion of both the first metal and the second metal is greater than the first coefficient of thermal expansion.

13. A semiconductor device encapsulated in a package and mounted to a lead frame having a plurality of leads extending outside the package, each of the plurality of leads comprising:

an "s" shaped copper member having an upward facing surface with concave and convex portions and having a downward facing surface with concave and convex portions;

a first metal alloy comprising 42% nickel and 57% iron bonded to only the convex portion of said upward facing surface;

a second metal alloy comprising 42% nickel and 57% iron bonded to only the convex portion of said downward facing surface; and both metal alloys having a coefficient of thermal expansion substantially different from the coefficient of thermal expansion of the "s" shaped copper member.

14. A semiconductor device encapsulated in a package and mounted to a lead frame having a plurality of leads extending outside the package, each of the plurality of leads comprising:

an "s" shaped copper member having an upward facing surface with concave and convex portions and having a downward facing surface with concave and convex portions;

a first metal alloy comprising 42% nickel and 57% iron bonded to only the concave portion of said upward facing surface;

a second metal alloy comprising 42% nickel and 57% iron bonded to only the concave portion of said downward facing surface; and both metal alloys having a coefficient of thermal expansion substantially different from the coefficient of thermal expansion of the "s" shaped copper member.

* * * * *